United States Patent [19]

Vesce et al.

[11] Patent Number: 4,788,462
[45] Date of Patent: Nov. 29, 1988

[54] POWER-ON-RESET (POR) CIRCUIT

[75] Inventors: Richard V. Vesce, East Hampton; John D. Repp, Jr., Canton, both of Conn.

[73] Assignee: United Technologies Corporation, Hartford, Conn.

[21] Appl. No.: 13,757

[22] Filed: Feb. 12, 1987

[51] Int. Cl.$^4$ ...................... H03K 5/153; H03K 17/22
[52] U.S. Cl. .................................... 307/597; 307/362; 307/296 R; 307/601
[58] Field of Search ........... 307/350, 358, 362, 296 R, 307/597, 592, 601, 200 A

[56] References Cited

U.S. PATENT DOCUMENTS

| 3,365,586 | 1/1968 | Billings | 307/362 |
| 4,260,907 | 4/1981 | Winebarger | 307/592 |
| 4,434,403 | 2/1984 | Chang | 307/350 |
| 4,473,759 | 9/1984 | Mahabadi | 307/350 |
| 4,611,126 | 9/1986 | Miller | 307/597 |

OTHER PUBLICATIONS

L. A. Blue et al., Automatic Restart for Microprocesesors, IBM Tech. Disc. Bull., vol. 26, No. 10A, Mar. 1984, pp. 5319-5320.

Primary Examiner—John Zazworsky
Attorney, Agent, or Firm—Francis J. Maguire, Jr.

[57] ABSTRACT

A Power-On-Reset (POR) Circuit compares a logic supply voltage to a reference voltage and provides a logic voltage validity signal if the logic voltage is greater than the reference voltage; the circuit delays, on startup, the validity signal for a selected period and then provides a drive signal for driving a solid-state switch which provides an open circuit on the presence of the drive signal, indicating logic voltage validity, and a short circuit in its absence, indicating invalidity; and the circuit immediately disables the drive signal if the logic voltage falls below the reference voltage. The selected start-up delay period is independent of the supply voltage magnitude.

4 Claims, 5 Drawing Sheets

POWER-ON-RESET (POR) CIRCUIT

TECHNICAL FIELD

This invention relates to power-on-reset (POR) circuitry and, more particularly, to a transient-free POR circuit design.

BACKGROUND ART

Power-On-Reset (POR) circuits are widely used throughout the electronics industry to hold microprocessor based systems in a "reset" mode, i.e., with a ground at the processor's RESET input, during power on and off transitions and other conditions when the logic voltage, typically 5 volts, is invalid.

Common and recurring problems with present day POR circuits relate to transients, or "glitches," on the POR output, missing POR signals, POR outputs not present when precisely required, and unwanted or multiple POR signals. These problems often result from inadequate circuit designs, accuracy errors in detecting precision threshold levels for valid logic power, propagation delay errors in generating the POR output, and slow rise and fall POR transition times.

Figure 1:
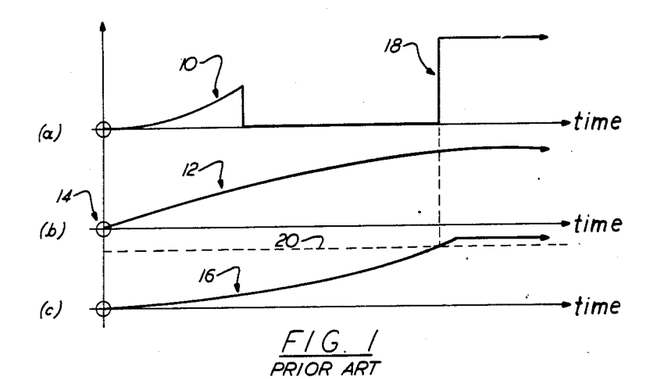
FIG. 1 is an illustration of a "glitch" or transient, as occurs in the prior art.

Comparators are commonly used to monitor the logic supply voltage and to generate the POR output. The basic problem with this approach is that with no power applied to the circuit, a comparator (having an open collector) has no supply voltage and, therefore, cannot always output the proper (ground) POR signal. When power is applied, a minimum supply voltage is required before the comparator can begin to operate properly. This results, as depicted in FIG. 1(a), in an inherent "glitch" 10 during turn-on. FIG. 1(b) shows the supply voltage 12 gradually being turned-on from a turned-off condition 14. FIG. 1(c) shows the logic voltage 16 rising concurrently. A POR signal 18 is shown properly occurring, in FIG. 1(a), when the logic voltage 16 rises to a selected valid level 20, as shown in FIG. 1(c). The "glitch" 10 condition occurs while the collector is still open, before the supply voltage is high enough to cause the comparator to operate properly. Such a "glitch" is totally unacceptable in multiple channel systems where one channel monitors the POR status of another channel.

Most present day POR circuits require a turn-on time delay to allow the logic supply to turn on and stabilize within its regulation band before the POR enable signal is generated. However, at turn-off, a time delay is not desirable since POR must be generated immediately in order to prevent the processor from operating during invalid power conditions.

Figure 2:
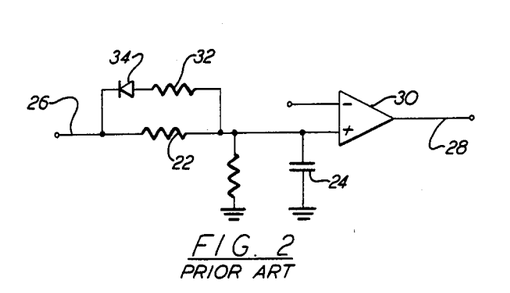
FIG. 2 is an illustration of a prior art POR circuit.
Figure 3:
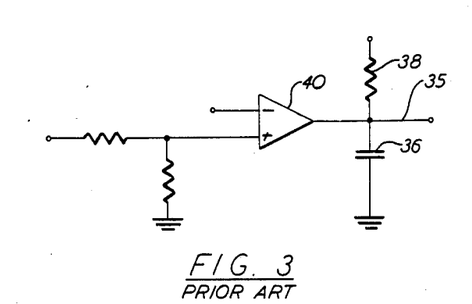
FIG. 3 is another illustration of a prior art POR circuit.

FIGS. 2 and 3 show prior art designs presently being used in an attempt to meet these delay requirements. The intent of the circuit of FIG. 2 is to provide a long time constant using a resistor 22 and a capacitor 24 when the 5 V logic on a line 26 is turned on (to delay the POR ground output on a line 28 from a comparator 30 from being removed too soon), and to provide a short time constant using a resistor 32 and capacitor 24 through a diode 34 when the 5 V logic on line 26 is turned off (in order to immediately apply a POR output ground when logic power becomes invalid). The problem with this circuit is that the voltage drop across diode 34 must exceed 0.7 V before the discharge path from capacitor 24 through resistor 32 can begin to conduct. This introduces an error of 0.7 V in the 5 V valid logic trip level which results in the microprocessor based system operating with invalid power.

The circit of FIG. 3 solves some of the problems related to that of FIG. 2. However, it creates new problems. When the POR output on a line 35 transitions from ground to open, a capacitor 36 charges to 5 V through a resistor 38, providing the desired time delay. However, the POR rising edge is slow, which is undesirable for good noise immunity and may produce "glitches" by not meeting the rise time requirements of the interface circuits. Also, the reliability of a comparator 40 is degraded due to being over stressed from high peak discharge currents from capacitor 36 each time the POR output is switched to ground.

Another approach to glitch problems is to buffer the output of the comparator with an n-channel, junction field effect transistor (JFET). The n-channel JFET is a "normally-on" device which means that, with no power applied to the circuit, the drain to source resistance is normally low, providing a valid POR signal. Since the n-channel JFET requires a negative gate voltage for "pinch-off" and since negative voltages are not generally available from the power bus, a negative bias voltage must be generated from the system's power supply. This presents a race condition during system power cycling. At turn-on, the negative bias voltage required for pinch-off and the positive supply voltage required to bias the comparator must race the logic supply to ensure that the comparator is operational before the logic supply becomes valid. At turn-off, the positive and negative bias supplies must remain operational until the logic supply becomes invalid. Variation in the logic loading will vary the time required for the logic supply to become valid and further complicate the race.

DISCLOSURE OF THE INVENTION

The object of the present invention is to monitor a logic voltage and to provide an immediate power-on-reset (POR) signal whenever the logic voltage is invalid and to remove the POR signal only after the logic voltage is valid for a selected period of time, without generating any unwanted or false POR output signals due to start-up transitions, noise pulses, or other "glitches."

According to the present invention, a POR circuit is responsive, on start-up, to the application of a reference voltage, a supply voltage and to a logic voltage. The reference voltage must, while the logic voltage is still below its valid level during start-up, have a magnitude which is greater than that of the logic voltage in order to prevent a glitch. Once the logic voltage exceeds its lowest acceptable validity level after the reference voltage reaches its reference level, then the logic voltage is freed to exceed the reference voltage in order that the POR circuit may begin to indicate validity. The supply voltage must reach a level sufficient to power the POR circuit before the logic voltage reaches its lowest acceptable valid level. The timing of the application of the reference, supply and logic voltages and their control is provided by external means, not relevant to the present invention. Suffice it to say that the three voltages behave as described above. The POR circuit itself comprises a solid-state switching means, esponsive to a drive signal for providing an open circuit (for connection to a signal processor reset input) in the presence of the drive signal and for providing a short circuit otherwise; a signalling means, responsive to the reference voltage, the supply voltage and the logic voltage, for providing a validity signal in the presence of the logic voltage magnitude being greater than that of the reference voltage; delay means, responsive to the supply voltage and to the validity signal for providing the drive signal only after the validity signal has persisted for a selected period; and, disable means, responsive to the drive signal and to the validity signal for disabling the drive signal in the absence of the validity signal.

In further accord with the present invention, the solid-state switching means may be a p-channel, junction field-effect-transistor (JFET).

In still further accord with the present invention, a POR circuit comprises a precision level detector responsive to a reference voltage, a supply voltage and a logic voltage, wherein on start-up the reference voltage and supply voltage are guaranteed by external circuitry (not relevant to the present invention, and therefore not shown herein) to be present before the logic voltage becomes valid, and wherein the reference voltage is guaranteed to be greater in magnitude than the logic voltage until the logic voltage achieves the level of minimum validity, i.e., after the reference voltage reaches its reference level, the level detector providing a validity signal in the presence of the logic voltage magnitude being greater than that of the reference voltage, and further comprising a precision time constant bridge circuit, responsive to the supply voltage and the validity signal for providing the drive signal only after the validity signal has persisted for a selected period, and further comprising a normally "on" p-channel JFET, responsive to the drive signal for disabling, i.e., open circuiting, the reset input of the associated microprocessor in the presence of the drive signal and for providing a short circuit otherwise, and further comprising a diode connected between the output of the precision time constant bridge circuit and the output of the precision level detector for disabling the drive signal, without delay, in the absence of a validity signal.

The invention disclosed herein is a unique, glitch-free circuit which immediately removes a power-on-reset (POR) signal (i.e., provides a short) whenever the logic power is invalid and generates the POR (i.e., provides an open) only after the logic power is valid for a specified period of time. Thus, the circuit provides a valid POR signal with no power applied and does not generate unwanted or false POR outputs due to start-up transitions, noise pulses, or glitches.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 4:
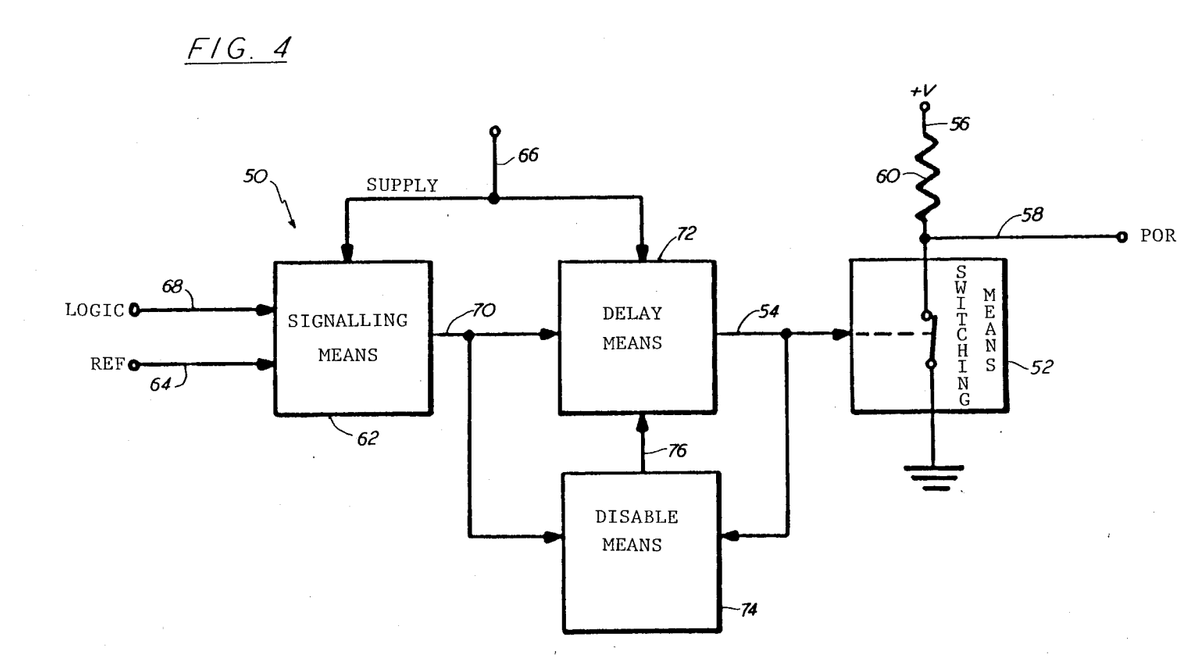
FIG. 4 is an illustration of a POR circuit, according to the present invention.

FIG. 4 is a simplified block diagram illustration of a power-on-reset (POR) circuit 50, according to the present invention. A solid-state switching means 52, shown in simplified form as a normally closed controllable switch, is responsive to a drive signal on a line 54 for providing an open circuit in the presence of the drive signal and for providing a short circuit otherwise. In other words, the solid-state switch 52 may be thought of, in the simplified illustration given in FIG. 4, as a normally closed (NC) switch. A voltage (+V) is applied on a line 56 and that voltage also appears on a line 58, which is the POR output signal line, whenever the switch 52 is open. It is this signal that is provided to the processor RESET input, indicating with the (+V) voltage that the logic voltage is valid. When the switch is closed, however, the voltage is impressed entirely across a resistor 60 and the voltage on line 58 is zero, being grounded through switch 52. This indicates that the logic voltage is invalid.

The POR circuit 50 also includes a signalling means 62 responsive to a reference voltage on a line 64, a supply voltage on a line 66 and a logic voltage on a line 68. The function of the signalling means is to provide a validity signal on a line 70 in the presence of the logic voltage magnitude being greater than that of the reference voltage. Typically, the signalling means will include a comparator driven by the supply voltage on the line 66. In order to prevent the comparator from generating a "glitch" at its output line 70 on start-up, it is essential that the reference signal on the line 64 be the first signal of the three signals on the line 64, 66, and 68 to be applied. The only other start-up requirements are that the voltage necessary for the comparator to operate properly as a comparator must be present before the logic voltage reaches its lowest validity level and also that the rising magnitude of the reference voltage must stay greater than the rising magnitude of the logic voltage until the lowest valid logic voltage level is reached i.e., until the logic voltage climbs above the reference voltage stabilized at its reference level. In this way, the validity signal on the line 70 will not indicate validity until actual validity of the logic voltage on start-up has been achieved.

The POR circuit 50 also comprises delay means 72, responsive to the supply voltage on the line 66 and to the validity signal on the line 70 for providing the drive signal on line 54 only after the validity signal has persisted for a selected period.

The POR circuit also includes a disable means 74, responsive to the validity signal on the line 70 and to the drive signal on the line 54 for providing a disable signal on a line 76 for disabling the drive signal in the absence of the validity signal.

It will be understood that the means by which it is guaranteed that the reference voltage is applied first and that it always stays ahead of the logic voltage during the increase of magnitudes of the these two voltages during start-up and also the circuitry necessary to ensure that the supply voltage on line 66 is at a level necessary to operate the signalling means properly is present before the logic voltage reaches its validity level, are provided by external circuitry not relevant to the present invention and are therefore not shown. It is a simple matter, however, to provide circuitry which ensures that these requirements are met.

Figure 5:
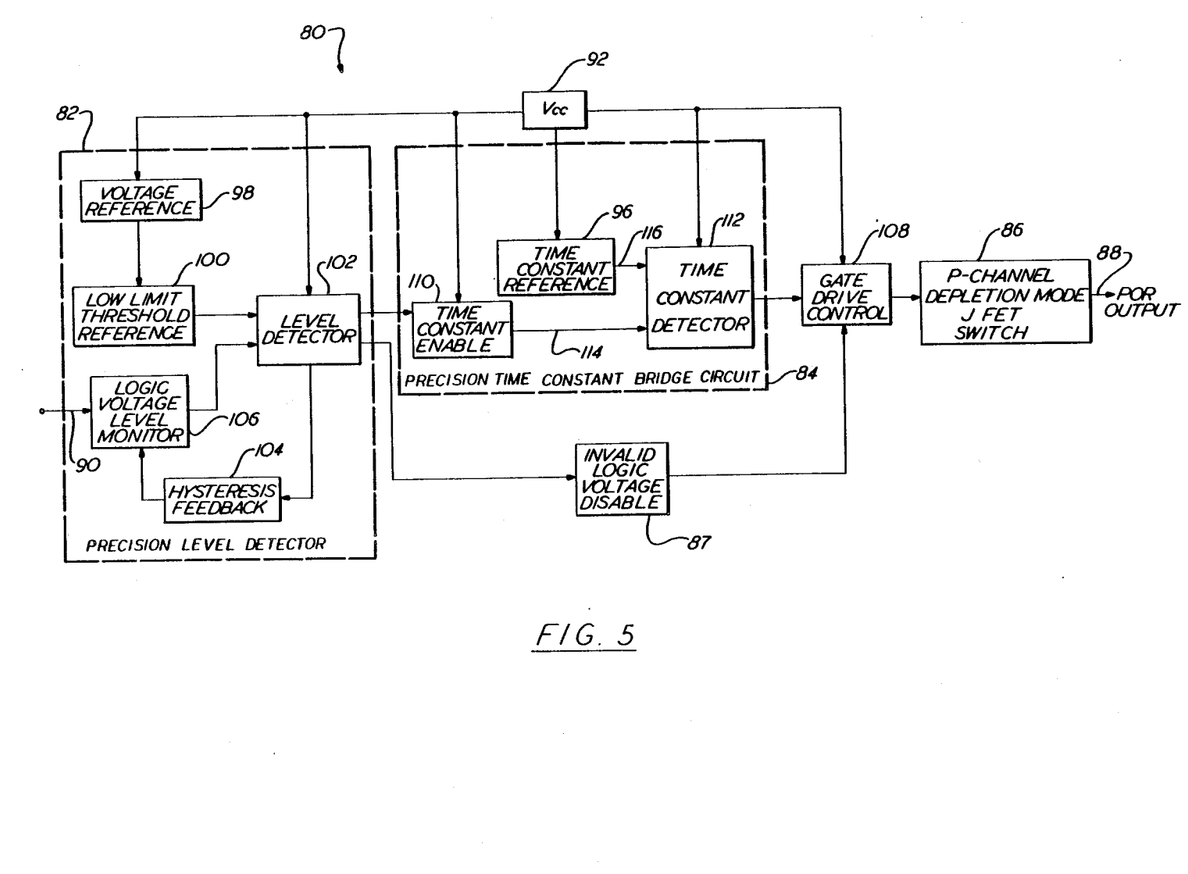
FIG. 5 is a simplified block diagram illustration of a POR circuit, according to the present invention.

FIG. 5 is a simplified block diagram illustration of a circuit 80, according to the present invention. The circuit 80 provides a precision level detector 82, a precision time constant bridge circuit 84, a normally "on" p-channel JFET 86 and a disable circuit 87. The circuit shown generates an immediate POR signal on a lline 88 only after a 5 V logic voltage on a line 90 is valid for a specified period of time. The circuit provides a valid POR signal with no power applied and does not generate wnwanted or false POR outputs due to start-up transitions, noise pulses, or glitches.

With no power applied to the circuit, the p-channel JFET switch 86 is normally "on" and the POR output is therefore "low" or in the "RESET" mode. At turn-on, supply voltage $V_{CC}$ 92 provides power to the circuit and generates a time constant reference 96 and a voltage reference 98 to establish a low limit threshold reference 100. The logic supply voltage on the line 90 is monitored by a level detector 102 which determines the state of the logic voltage as being either valid (above the low limit threshold reference 100), or invalid (below the low limit threshold reference). The level detector utilizes hystersis feedback 104 to a logic voltage level monitor 106 to prevent "toggling" between states at the threshold level. During turn-on, when the logic voltage is invalid, the level detector disables a gate drive control 108 to the JFET such that the JFET device is "on" and the POR output is low or in the "RESET" mode.

When the logic voltage on line 90 becomes valid, the level detector 102 enables a time constant enable 110, which may be an RC time constant generator, and which provides an actual time charge signal on a line 114. A time constant detector 112 compares the actual time charge signal on the line 114 to a reference signal on a line 116 which is selected to attenuate $V_{CC}$ by 63%. This generates a time delay of one RC time constant from the time the logic supply becomes valid until the output of the time constant detector 112 switches to enable the gate drive 108 to the JFET. When the gate drive 108 is enabled, the JFET is pinched "off" and the POR output is high or in the "NON-RESET" mode. This transition occurs one RC time constant after the logic voltage becomes valid.

When the logic supply voltage drops from a valid to an invalid state, the level detector 82 will bypass the RC time delay and directly disable the gate drive to the JFET via the invalid logic disable 87. This turns the JFET "on" which generates an immediate POR output (ground) when the logic voltage becomes invalid.

Figure 6:
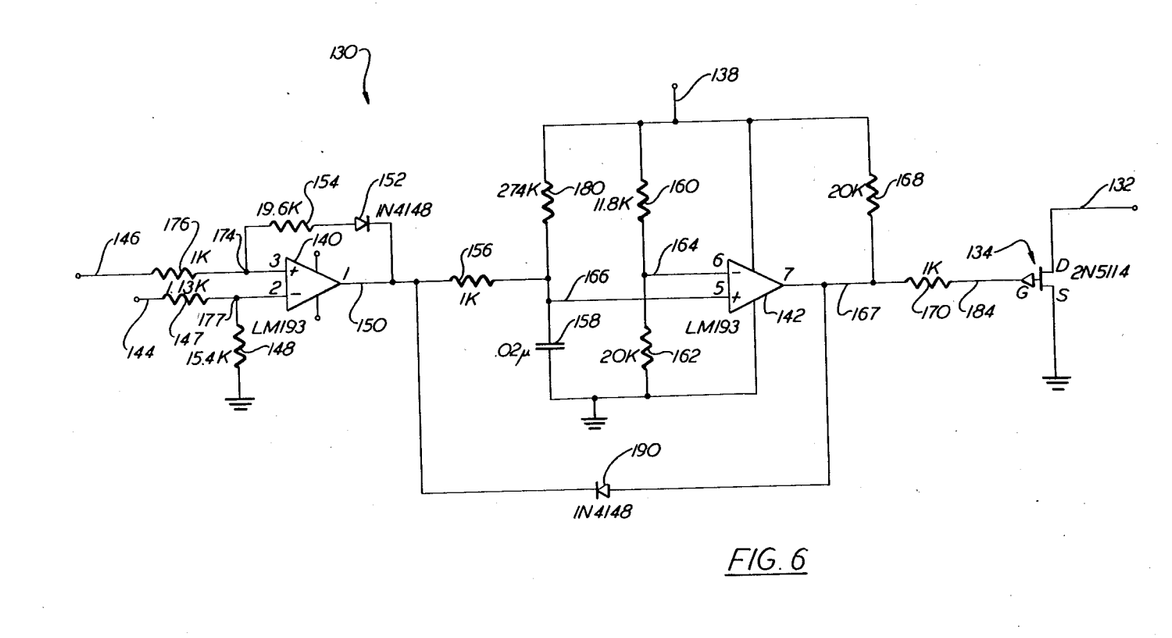
FIG. 6 is a detailed schematic illustration of a POR circuit, according to the present invention.

Referring now to FIG. 6, a more detailed schematic diagram of a POR circuit 130, according to the present invention, is illustrated. With no power applied to the circuit, a POR output signal on a line 132 has a low impedance to ground (75-150 ohms) due to the normally "on" characteristic of depletion mode, "p" channel JFET 134. When power is applied, a supply voltage on a line 138 is generated from an auxiliary supply and provides voltage to comparators 140, 142. (Although the power hookup to comparator 140 is not shown in as great detail as that of comparator 142, it is similar.) The source supplying the supply voltage on the line 138 also generates a reference voltage on a line 144 applied to a resistor divider 147, 148. The method of generating the reference voltage on the line 144 from the source voltage is not revelant to the present invention, and therefore, is not shown. However, it is important that the reference voltage on the line 144 be always greater than a logic voltage level on a line 146 during the period of time while the logic voltage is below its valid level. It is also important to ensure that the supply voltage supplying the comparators 140, 142 is of a sufficient magnitude to operate the comparators as comparators before the logic voltage reaches its valid level on start-up. Thus, the voltage on the line 144 is always ahead of, in the sense of having a higher magnitude, the voltage on the line 146 during start-up, at least until the logic voltage reaches its valid level. Again, however, the circuitry necessary to ensure that these requirements are met in the proper manner is not relevant to the present invention and is not shown.

The values of resistors 147, 148 are determined such that the lower limit of the logic supply voltage specification appears on the inverting input of comparator 140 (pin 2 of a National Semiconductor LM193, for example). By design, as mentioned above, the reference voltage on the line 144 is always present before the logic voltage is generated, and therefore, the voltage on the inverting input of the comparator 140 is initially higher than the voltage on the non-inverting input (pin 3), which results in a low output on a line 150 (pin 1 of an LM193). Whenever the output of comparator 140 is low, a diode 152 (which may be a 1N4148) clamps a hysteresis resistor 154 to virtual ground, and a resistor 156 clamps the voltage across a capacitor 158 and a non-inverting input of the comparator 142 to virtual zero. The comparator 142 may, by way of example and not limitation, be the second half of the LM193 mentioned before, manufactured by National Semiconductor. The time constant reference voltage on the inverting input of comparator 142 is designed in the embodiment shown to be 63% of the supply voltage on the line 138 and is determined by a resistor divider 160, 162. Of course, other values could have easily been selected for different delay periods. During turn-on, a line 164 to the non-inverting input of comparator 142 is initially higher than the voltage on the non-inverting input as provided on line 166. Therefore, the output of comparator 142 (pin 7) clamps the junction 167 of resistors 168, 170 "low" which ensures that JFET 134 is "on" and that POR is in the RESET mode (drain to source impedance low).

The logic voltage on line 146 is sensed at the non-inverting input of comparator 140 at the junction 174 of a resistor divider 176, 154. During turn-on, the logic voltage increases to a level which causes the voltage on the non-inverting input of comparator 140 to exceed the reference voltage on the inverting input thereof at the junction 177 of resistors 147, 148. At this point, the logic voltage on the line 146 is at the lower limit of the regulation band, i.e., its lowest valid level, and the output of comparator 140 on line 150 switches from ground to an open circuit. This removes the virtual ground on resistor 154 which provides trip level hysteresis and allows capacitor 158 to charge from supply line 138. The charging time constant is determined by the values of a resistor 180 and capacitor 158, which are selected to ensure that the logic supply has sufficient time to stabilize within its regulation band before POR is given. The voltage level at 164 is a percent of the supply voltage $V_{CC}$ at 138. This percent is determined by the selection of resistor divider values 160 and 162. This percent represents the value at which capacitor 158 is charged just prior to tripping comparator 142. Therefore, the exact delay time can be precisely determined by the classic equation $V_C = V_I + V_F(1 - e^{-t/\tau})$:

$$V_C = V_I + V_F(1 - e^{-t/\tau})$$

where $V_C$ = voltage across the capacitor;
$V_I$ = Initial value of voltage on capacitor;
$V_F$ = Final value of voltage on capacitor;
$\tau$ = RC time constant where C is the value of capacitance and R is the value of resistance in series with the capacitor being charged and the voltage source ($V_{CC}$) charging the capacitor;
t = time delay.

The voltage trip level at which comparator 142 will change is determined by the following equation:

$$V_T = \frac{R(162)}{R(160) + R(162)} V_{CC}$$

The following equation is true just prior to tripping $$V_C = V_T$$

Therefore, at the trip point $$V_I + V_F(1 - e^{-t/\tau}) = \frac{R(162)}{R(160) + R(162)} V_{CC}$$

Since $V_I = 0$ and $V_F = V_{CC}$ $$0 + V_{CC}(1 - e^{-t/\tau}) = \frac{R(162)}{R(160) + R(162)} V_{CC}$$

and simplifying $$1 - e^{-t/\tau} = \frac{R(162)}{R(160) + R(162)}$$

$$e^{-t/\tau} = 1 - \frac{R(162)}{R(160) + R(162)} = \frac{R(160)}{R(160) + R(162)}$$

$$e^{t/\tau} = \frac{R(160) + R(162)}{R(160)}$$

$$t/\tau = \ln \frac{R(160) + R(162)}{R(160)}$$

$$t = RC \ln \frac{R(160) + R(162)}{R(160)}$$

Therefore, the time delay from the time a valid logic level exists to the time of comparator trip is independent of supply voltage $V_{CC}$.

For illustration purposes the voltage divider used in this example is 63% or one $\tau$. It should be understood, however, that this invention is not limited to one time constant ($\tau$) and that any other suitable time constant can be used. Since the inverting input (pin 6) of comparator 142 is initially 63% higher in voltage than the non-inverting input (pin 5), the output of comparator 142 (pin 7) on the line 167 is low for exactly one time constant after the logic voltage reaches the minimum value of its specification band. This ensures that the gate signal on a line 184 is held "low," and therefore, the POR signal is guaranteed "low" throughout the entire turn-on sequence and for one time constant after the logic voltage becomes valid. At the end of one time constant, the voltage on the non-inverting input of comparator 142 becomes higher than the voltage on the inverting input thereof and the output of the comparator 142 on line 182 therefore switches from ground to an open circuit. This enables the gate drives signal on line 184 to be energized at the supply voltage 138 level through resistors 168, 170, which turns the JFET 134 "off".

If the logic voltage on line 146 later drops below the lower level specification limit, the voltage on the non-inverting input of comparator 140, i.e., the signal on line 174, drops lower than the reference voltage on the inverting input to the comparator, i.e., the signal on line 177, and the output on line 150 switches from an open to a ground. Resistor 156 is selected to limit the discharge resultant current from capacitor 158 to a safe level through comparator 140, pin 1.

If not corrected, the discharge time constant of resistor 156 and capacitor 158 will introduce a delay error in POR and allow the logic voltage on line 146 to drop much lower than the specification limit before POR is generated. Diode 190 is utilized to correct the situation by instantaneously clamping the gate drive of JFET 134 to ground which turns the JFET "on" and outputs a valid POR (ground) instantaneously when the logic voltage drops below the specification limit.

Figure 7:
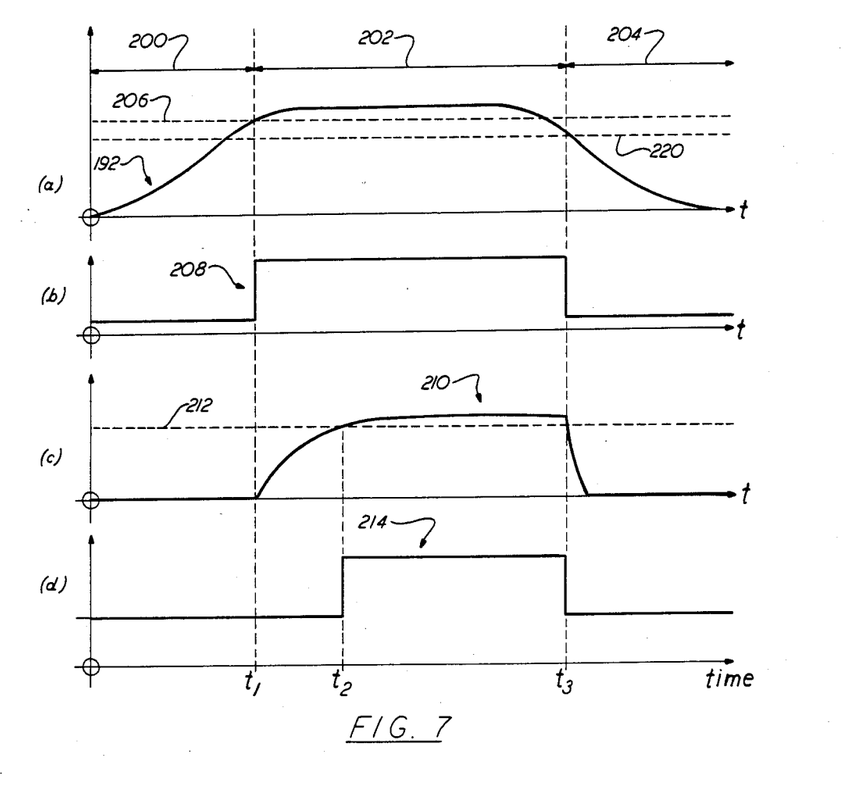
FIG. 7 shows a group of waveforms illustrative of the timing of POR in relation to startup, normal operation, and power loss.

FIG. 7 is an illustration of the timing sequence of POR relative to the logic voltage on line 146 of FIG. 6. FIG. 7(a) shows the logic voltage on line 146 as a waveform 192 during a turn-on period 200, a normal operating period 202 and a turn-off period 204. During the turn-on period 200, the logic voltage on line 146 is shown in FIG. 7(a) as rising gradually up to its lowest valid level 206 at a time $t_1$, at which point, as shown in FIG. 7(b), the level detector comparator 140 output on line 150, as illustrated in a waveform 208, goes high. FIG. 7(c) shows the voltage on the capacitor 158, as illustrated in a waveform 210, beginning to charge at point $t_1$ and reaching a level 212 corresponding to the reference voltage level on line 164. At this point in time ($t_2$) a POR signal waveform 214 in FIG. 7(d) is shown rising to indicate on line 132 to the RESET input of the processor, that the logic voltage is valid. The short delay between $t_1$ and $t_2$ is necessary to ensure that the logic voltage had stabilized.

In the example of FIG. 7, after a short normal operating period 202, the logic voltage begins to decline, as shown in FIG. 7(a), period 204. It goes below the lowest valid level 206, through a hysteresis band between the level 206 and a lower, hysteresis level 220, until, at a point in time $t_3$ the level detector comparator 140 provides a virtual ground on line 150 which diode 190 immediately clamps to line 167, thereby removing the drive voltage on the gate of the JFET 134 and causing the signal on line 132 to be shorted as shown in FIG. 7(d). Thus, without the diode 190, the mere drop off of the output of the level detector as shown in FIG. 7(b) would not have been sufficient to immediately cutoff the JFET due to the necessity of waiting for the capacitor 158 to discharge through resistor 156. This is shown by waveform 210 in FIG. 7(c) during time interval 204. The presence of the diode 190, on the other hand, permits the immediate clamping of the JFET drive voltage to virtual ground and the immediate notification to the processor that the logic voltage is invalid at time $t_3$.

Although the invention has been shown and described with respect to a best mode embodiment thereof, it should be understood by those skilled in the art that the foregoing and various other changes, omissions, and additions in the form and detail thereof may be made therein without departing from the spirit and scope of the invention.

We claim:

1. A POR circuit, comprising:

solid-state switching means, responsive to a drive signal for providing an open circuit in the presence of said drive signal and for providing a short circuit otherwise;

signalling means, responsive to a reference voltage and a logic voltage having a minimum valid magnitude, said signalling means providing a validity signal in the presence of the logic voltage magnitude being greater than that of the reference voltage, said reference voltage being greater than said logic voltage during startup while said logic voltage is still below said minimum valid magnitude;

delay means, responsive to said validity signal for providing said drive signal only after said validity signal has persisted for a selected period; and disable means, responsive to said validity signal and to said drive signal for disabling said drive signal in the absence of said validity signal.

2. The POR circuit of claim 1, wherein said solid-state switching means is a p-channel, depletion mode, junction field effect transistor.

3. The POR circuit of claim 1, wherein said signalling means and said delay means are also responsive to a supply voltage and wherein said selected period is independent of the magnitude of said supply voltage.

4. The POR circuit of claim 1, wherein said signalling means and said delay means are also responsive to a supply voltage and wherein said supply voltage has a sufficient magnitude to power said signalling means and said delay means on startup before said logic voltage reaches said minimum valid magnitude.

* * * * *